(12) United States Patent
Kim et al.

(10) Patent No.: US 10,164,171 B2
(45) Date of Patent: Dec. 25, 2018

(54) ELECTRONIC DEVICE AND METHOD FOR FABRICATING THE SAME

(71) Applicants: SK hynix Inc., Icheon-Si (KR); Chun-Yeol You, Seoul (KR)

(72) Inventors: June-Seo Kim, Icheon-si (KR); Sung-Joon Yoon, Icheon-si (KR); Jung-Hwan Moon, Icheon-si (KR); Jeong-Myeong Kim, Icheon-si (KR); Chun-Yeol You, Seoul (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 15/410,571

(22) Filed: Jan. 19, 2017

(65) Prior Publication Data

US 2017/0317272 A1 Nov. 2, 2017

(30) Foreign Application Priority Data

May 2, 2016 (KR) .................. 10-2016-0053841

(51) Int. Cl.

| | |
|---|---|
| *H01L 43/08* | (2006.01) |
| *H01L 43/02* | (2006.01) |
| *H01L 43/12* | (2006.01) |
| *G11C 11/16* | (2006.01) |
| *H01L 43/10* | (2006.01) |

(52) U.S. Cl.
CPC ............. *H01L 43/08* (2013.01); *H01L 43/02* (2013.01); *H01L 43/12* (2013.01); *G11C 11/161* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 2008/0218910 A1* | 9/2008 | Kojima | B82Y 25/00 360/319 |
| 2014/0170776 A1 | 6/2014 | Satoh et al. | |

FOREIGN PATENT DOCUMENTS

KR    10-1361719 B1    2/2014

OTHER PUBLICATIONS

You, Reduced Switching Current Density in Spin Transfer Torque with Lateral Symmetry Breaking Structure, Appl Phy Exp, 6, pp. 103001-1-3, 2013.

* cited by examiner

*Primary Examiner* — Long Pham
(74) *Attorney, Agent, or Firm* — Perkins Coie LLP

(57) ABSTRACT

The disclosed technology includes an electronic device. The electronic device includes a semiconductor memory, and the semiconductor memory includes a variable resistance element that exhibits different resistance states for storing different data and is structured to include a planar shape including two curved potions of different curvatures.

13 Claims, 8 Drawing Sheets

ELECTRONIC DEVICE AND METHOD FOR FABRICATING THE SAME

CROSS-REFERENCE TO RELATED APPLICATION

This patent document claims priority of Korean Patent Application No. 10-2016-0053841, entitled "ELECTRONIC DEVICE AND METHOD FOR FABRICATING THE SAME" and filed on May 2, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an resistive random access memory (RRAM), a phase change random access memory (PRAM), an ferroelectric random access memory (FRAM), an magnetic random access memory (MRAM), an E-fuse, etc.

SUMMARY

The disclosed technology in this patent document includes memory circuits or devices and their applications in electronic devices or systems and various implementations of an electronic device having a variable resistance element with an improved characteristic and method for fabricating the same.

In an aspect, an electronic device may include a semiconductor memory. The semiconductor memory may include a variable resistance element that exhibits different resistance states for storing different data and is structured to include a planar shape including two curved potions of different curvatures.

In some implementations, the planar shape may include a gibbous moon planar shape. In some implementations, the planar shape of the variable resistance element may include a first curved portion that is a circular sector of a circle and a second curved portion that has an edge located closer from the center than a circumference of the circle. In some implementations, the two curved portions may have different central angles. The two curved portions of different curvatures may share a common center. In some implementations, the sum of the central angles of the at least two curved portions may be 360°. In some implementations, the planar shape of the variable resistance element may include a single closed curve shape including two or more curves of which edge lines have different curvatures. In some implementations, the variable resistance element may include a magnetic tunnel junction structure in which a tunnel barrier layer is interposed between two magnetic layers. In some implementations, the variable resistance element may further include a plurality of function layers formed to be in contact with the magnetic tunnel junction structure. In some implementations, a sidewall of the magnetic tunnel junction structure and sidewalls of the plurality of function layers may be aligned with each other, and the planar shape of the magnetic tunnel junction structure and planar shapes of the plurality of function layers may be the same as each other.

In some implementations, the electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further comprise a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating of an electronic device may include forming a variable resistance layer on a wafer; and forming a variable resistance pattern by etching the variable resistance layer, wherein the forming of the variable resistance pattern includes performing an ion beam etching in which an ion beam is supplied in a pulse form while rotating the wafer.

In some implementations, a pulse period of the ion beam may be twice a pulse width, and a duty ratio of the ion beam may be a 50:50. In some implementations, the performing of the ion beam etching may include radiating the ion beam diagonally with a predetermined incidence angle. In some implementations, the performing of the ion beam etching may include configuring the variable resistance pattern to have a gibbous moon planar shape, wherein in the forming of the variable resistance pattern, a rotation period of the wafer and a pulse period of the ion beam may be controlled to be equal. In some implementations, the performing of the ion beam etching may include configuring the variable resistance pattern to have an elliptical planar shape, wherein in the forming of the variable resistance pattern, a pulse period of the ion beam may be controlled to be two times greater than a rotation period of the wafer. In some implementations, the performing of the ion beam etching may include configuring the variable resistance pattern to have a cross planar shape, wherein in the forming of the variable resistance pattern, a pulse period of the ion beam may be controlled to be four times greater than a rotation period of the wafer.

In another aspect, a method for fabricating of an electronic device may include forming a variable resistance layer on a wafer; and forming a variable resistance pattern by etching the variable resistance layer using an ion beam etching in which an ion beam is supplied in a pulse form while rotating the wafer, wherein the etching of the variable resistance layer is performed to configure the variable resistance pattern to have a gibbous moon planar shape.

In some implementations, the forming of the variable resistance pattern, a rotation period of the wafer and a pulse period of the ion beam may be controlled to be equal. In some implementations, a pulse period of the ion beam may be twice a pulse width, and a duty ratio of the ion beam may be a 50:50. The forming of the variable resistance pattern, the ion beam may be diagonally irradiated with a predetermined incidence angle.

According to the disclosed technology, a switching current of a variable resistance element may be reduced and a fabricating process may be simplified by forming a planar shape of a variable resistance pattern in a gibbous moon shape.

DETAILED DESCRIPTION

Figure 1:
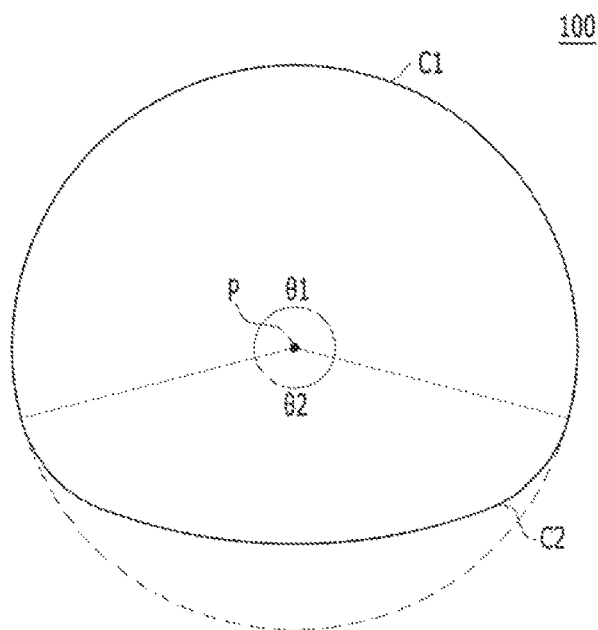
FIG. 1 is a plan view explaining a planar shape of a variable resistance element in accordance with an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various examples and implementations of the disclosed technology to be described later include electronic devices having a variable resistance element with an improved characteristic and method for fabricating the same. The variable resistance element may refer to an element which may be switched between different resistance states, for example, between high resistance and low resistance, in response to a bias, for example, current or voltage applied thereto. Accordingly, the variable resistance element with an improved characteristic may be an element that a switching current required for switching between different resistance states may be reduced.

Figure 2:
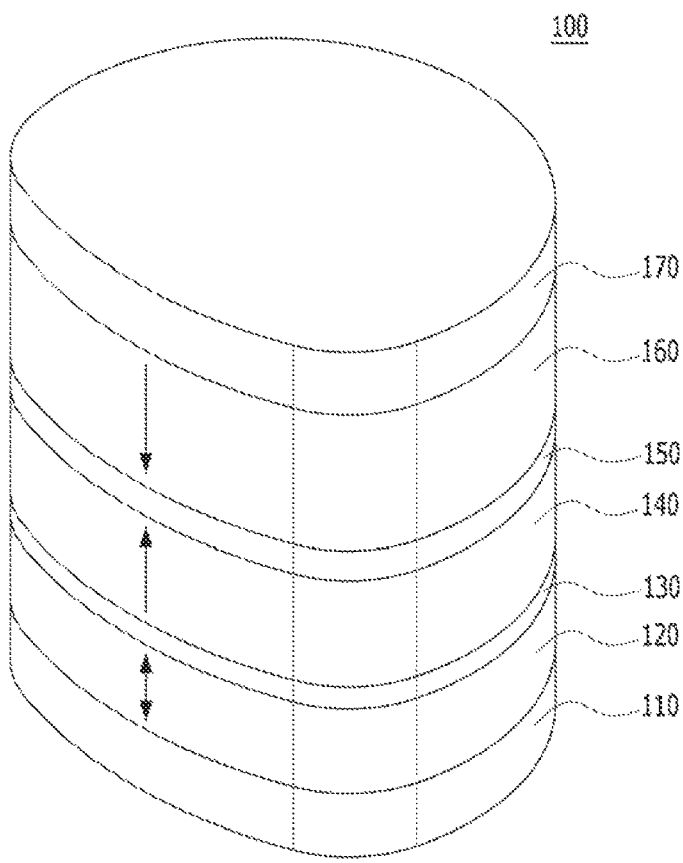
FIG. 2 is a perspective view illustrating a variable resistance element in accordance with an implementation of the disclosed technology.

FIG. 1 is a plan view explaining a planar shape of a variable resistance element in accordance with an implementation, and FIG. 2 is a perspective view illustrating a variable resistance element in accordance with an implementation.

As illustrated in FIG. 1, a variable resistance element 100 may have an asymmetrical planar shape to reduce a switching current. For example, the planar shape of the variable resistance element 100 may be a gibbous moon shape. A part of the variable resistance element indicated by a dotted line in FIG. 1 illustrates a full moon shape or a circular shape, and is to illustrate the gibbous moon shape as the planar shape of the variable resistance element 100.

The planar shape of the variable resistance element 100 may have a combined shape of a first fan shape and a second fan shape which share a common center point P. The first curved portion and the second curved portion may have different central angles θ1 and θ2. The sum of the central angle θ1 of the first curved portion and the central angle θ2 of second curved portion is 360°. Herein, the curvature of the curve C1 of the first curved portion may be different from the curvature of the curve C2 of the second curved portion to reduce the switching current of the variable resistance element 100. Specifically, the first curved portion that is a circular sector of a circle and the second curved portion that has an edge located closer from the center than a circumference of the circle. The first curved portion and the second curved portion have different central angles θ1 and θ2. The first curved portion and the second curved portion of different curvatures share a common center P.

Also, the planar shape of the variable resistance element 100 may have a single closed curve shape including two or more curves C1 and C2 of which edge lines have different curvatures.

Generally, the planar shape of the variable resistance element is mostly the circular shape or an elliptical shape, and the elliptical planar shape may further reduce the switching current relative to the switching current for the circular planar shape. To further reduce the switching current, the planar shape may be configured to have the elliptical shape of which one side edge in the major axis direction is cut. However, it is difficult to apply the planar shape of the elliptical shape with the edge cut on one side in the major axis direction to mass production due to difficulties of a manufacturing process and increase of a process step.

In an implementation of the disclosed technology, the variable resistance element 100 may have the asymmetrical planar shape which is similar to the planar shape having the elliptical shape with the edge cut on one side in the major axis direction. For example, the asymmetrical planar shape may have the gibbous moon shape. Accordingly, the switching characteristic is the same characteristic as or better than that in the planar shape of the elliptical shape with the edge cut on one side in the major axis direction. Also, the gibbous moon shape of the variable resistance element 100 may have outstanding advantages in terms of the manufacturing process. A method for fabricating the variable resistance element 100 having the gibbous moon shape will be described later.

As illustrated in FIG. 2, a variable resistance element 100 may include a lower layer 110, a free layer 120 having a changeable magnetization direction formed on the lower layer 110, a tunnel barrier layer 130 is formed on the free layer 120, a pinned layer 140 having a pinned magnetization direction formed on the tunnel barrier layer 130, a spacer layer 150 is formed on the pinned layer 140, a magnetic correction layer 160 is formed on the spacer layer 150, and a capping layer 170 is formed on the magnetic correction layer 160. Herein, a structure having the free layer 120, the pinned layer 140, and the tunnel barrier layer 130 interposed therebetween may refer to a magnetic tunnel junction (MTJ) structure.

In the magnetic tunnel junction (MTJ) structure, the free layer 120 may substantially store data in accordance with a magnetization direction because the magnetization direction of the free layer 120 is variable. Accordingly, the free layer 120 may be referred as a storage layer.

The variation in the magnetization direction of the free layer 120 may depend upon a spin transfer torque. The magnetization direction of the pinned layer 140 is pinned unlike the magnetization direction of the free layer 120, and the pinned layer 140 may be referred as a reference layer. The tunnel barrier layer 130 may serve to change the magnetization direction of the free layer 120 by enabling tunneling of an electron. The free layer 120 and the pinned layer 140 may have the magnetization direction perpendicular to the surfaces thereof. For example, as indicated by an arrow in FIG. 2, the magnetization direction of the free layer 120 may be directed toward a bottom from a top or may be directed toward the top from the bottom. The magnetization direction of the pinned layer 140 may be pinned to a direction toward the top from the bottom.

The magnetization direction of the free layer 120 may be changed according to a voltage or current applied to the variable resistance element 100, and thus the magnetization direction of the free layer 120 may be in parallel or anti-parallel to the magnetization direction of the pinned layer 140. Accordingly, the variable resistance element 100 may be switched between a low resistance state in which the magnetization directions are the parallel to each other and a high resistance state in which the magnetization directions are the anti-parallel to each other, and store different data. That is, the variable resistance element 100 may function as a memory cell.

The free layer 120 and the pinned layer 140 may include a single-layered structure or a multilayered structure including ferromagnetic materials. For example, the free layer 120 and the pinned layer 140 may include an alloy which contains Fe, Ni or Co as a main component, for example, a Co—Fe—B alloy, a Co—Fe—B—X alloy (herein, X may be Al, Si, Ti, V, Cr, Ni, Ga, Ge, Zr, Nb, Mo, Pd, Ag, Hf, Ta, W or Pt), a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, a Fe—Pd alloy, a Co—Pd alloy, a Co—Pt alloy, a Fe—Ni—Pt alloy, a Co—Fe—Pt alloy, or a Co—Ni—Pt alloy, and so on. Also, the free layer 120 and the pinned layer 140 may include a stacking structure such as Co/Pt, or Co/Pd and so on. Also, the free layer 120 and the pinned layer 140 may include an alternately stacking structure of magnetic materials and non-magnetic materials. The tunnel barrier layer 130 may include a dielectric oxide, for example, MgO, CaO, SrO, TiO, VO, or NbO and so on.

The variable resistance element 100 may further include various function layers which are formed over or below the magnetic tunnel junction (MTJ) structure to be in contact with the magnetic tunnel junction (MTJ) structure to improve characteristics required in the magnetic tunnel junction (MTJ) structure. At this time, a sidewall of the magnetic tunnel junction (MTJ) structure and sidewalls of a plurality of function layers may be aligned with each other. That is, the planar shape of the magnetic tunnel junction (MTJ) structure and planar shapes of the plurality of function layers may be the same. In the implementation, the plurality of function layers may include the lower layer 110, the spacer layer 150, the magnetic correction layer 160 and the capping layer 170, but the present implementation is not limited to such an example.

The lower layer 110 may be used to improve perpendicular magnetic anisotropy or crystallinity of the free layer 120 which is located on the lower layer. The lower layer 110 may include the single-layered structure or the multilayered structure including various conductive materials such as a metal, or a metal nitride and so on.

The magnetic correction layer 160 may serve to offset or reduce the effect of the stray field which is generated by the pinned layer 140. The magnetic correction layer 160 may reduce a bias magnetic field in the free layer 120 by reducing the impact of the stray field of the pinned layer 140 on the free layer 120. The magnetic correction layer 160 may be formed on a cooled substrate, and include the alternately stacking structure of the magnetic materials and the non-magnetic materials. Herein, the magnetic materials may include such as Co, Fe, or Ni and so on, and the non-magnetic materials may include such as Pt, or Pd and so on. The magnetization direction of the magnetic correction layer 160 may be in anti-parallel to the magnetization direction of the pinned layer 140. When the magnetization direction of the pinned layer 140 is directed toward the top from the bottom, the magnetization direction of the magnetic correction layer 160 may be directed toward the bottom from the top. When the magnetization direction of the pinned layer 140 is directed toward the bottom from the top, the magnetization direction of the magnetic correction layer 160 may be directed toward the top from the bottom.

The spacer layer 150 interposed between the magnetic correction layer 160 and the pinned layer 140 may be used to supply exchange coupling therebetween. The spacer layer 150 may include a metal non-magnetic material, for example, such as Cr, Ru, Ir, or Rh and so on.

The capping layer 170 may serve as a hard mask when the variable resistance element 100 is patterned. The capping layer 170 may include various conductive materials such as a metal and so on.

As described above, in the implementation, since the variable resistance element 100 has the gibbous moon planar shape, the switching current of the variable resistance element 100 may effectively be reduced. Also, the variable resistance element 100 having the gibbous moon planar shape may improve the efficiency of an annealing process due to increase in a surface area as compared with the circular planar shape or the elliptical planar shape, and thus a characteristic of the variable resistance element 100, for example, the magnetic anisotropy may be further improved.

Figure 3A:
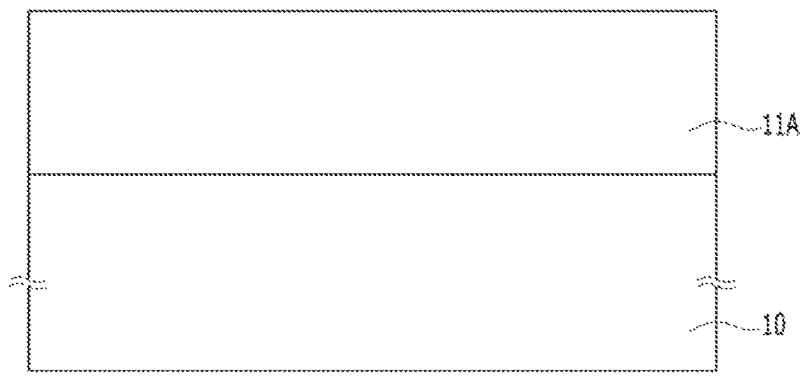
FIGS. 3A to 3C are cross-sectional views illustrating a method for fabricating a variable resistance element in accordance with an implementation of the disclosed technology.
Figure 3B:
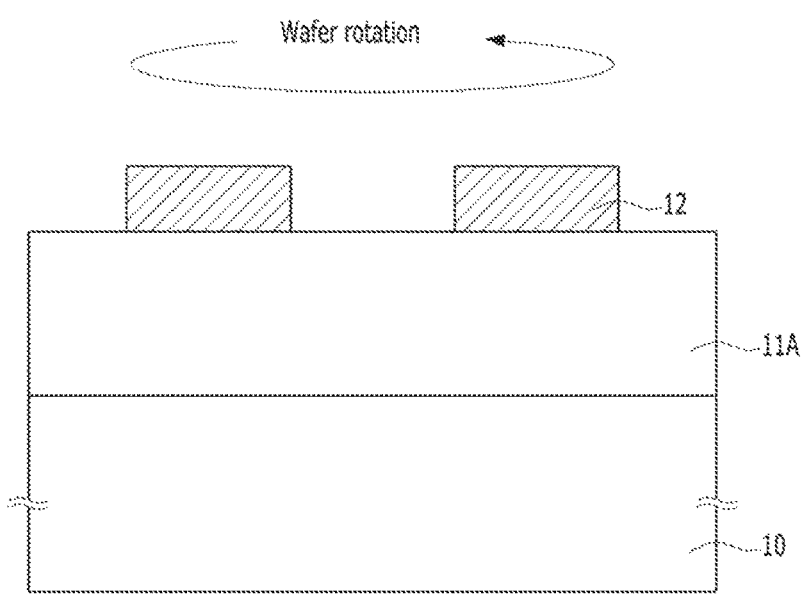
Figure 3C:
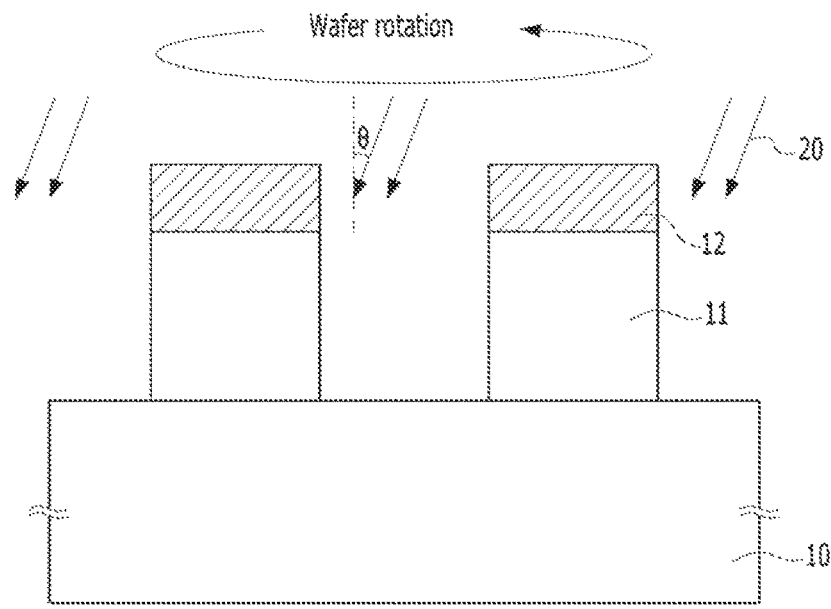
Figure 4:
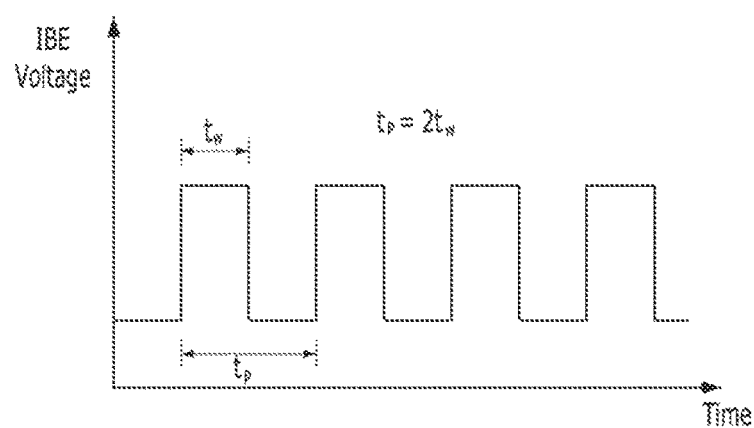
FIG. 4 is a schematic diagram illustrating an ion beam which is supplied in a pulse unit in a method for fabricating a variable resistance element in accordance with an implementation of the disclosed technology.
Figure 5A:
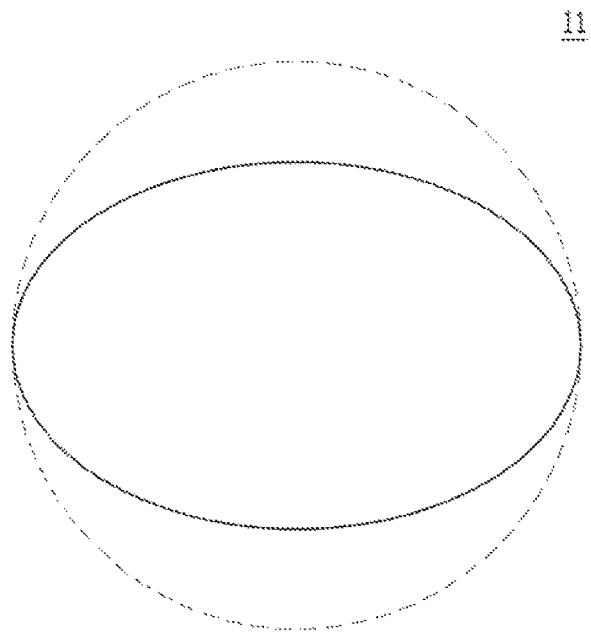
FIGS. 5A and 5B are diagrams illustrating a planar shape of a variable resistance pattern which can be formed by applying ion beam etching in accordance with an implementation of the disclosed technology.
Figure 5B:
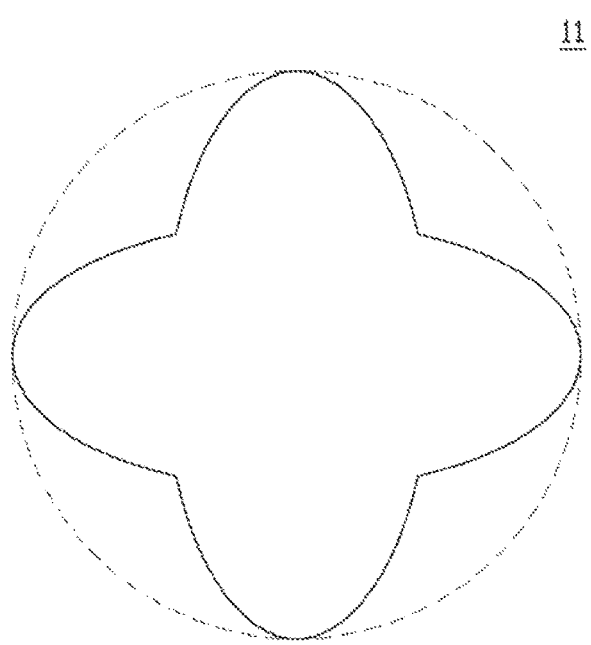

FIGS. 3A to 3C are cross-sectional views illustrating a method for fabricating a variable resistance element in accordance with an implementation. FIG. 4 is a schematic diagram illustrating an ion beam which is supplied in a pulse unit in a method for fabricating a variable resistance element in accordance with an implementation. FIGS. 5A and 5B are diagrams illustrating a planar shape of a variable resistance pattern which can be formed by applying ion beam etching in accordance with an implementation.

As illustrated in FIG. 3A, a variable resistance layer 11A may be formed on a wafer 10. Although not shown in FIG. 3A, as illustrated in FIG. 2, the variable resistance layer 11A may include the lower layer 110, the free layer 120 having the changeable magnetization direction formed on the lower layer 110, the tunnel barrier layer 130 formed on the free layer 120, the pinned layer 140 having the pinned magnetization direction formed on the tunnel barrier layer 130, the spacer layer 150 formed on the pinned layer 140, and the magnetic correction layer 160 formed on the spacer layer 150 and the capping layer 170.

As illustrated in FIG. 3B, a hard mask pattern 12 may be formed on the variable resistance layer 11A. The planar shape of the hard mask pattern 12 may be or include a circular shape.

In an implementation, it has been illustrated that the separate hard mask pattern 12 is formed on the variable resistance layer 11A, but the capping layer 170 may be used as the hard mask pattern 12 as illustrated in FIG. 2.

After the wafer 10 may be loaded to an ion beam etching chamber, the wafer 10 may be rotated at a constant speed. Herein, a time required for one rotation of the wafer 10 may be referred to as a rotation period of the wafer 10, and the rotation period of the wafer 10 is constant. Hereinafter, the rotation period of the wafer 10 refers to '$t_R$'.

As illustrated in FIGS. 3C and 4, in a state in which the wafer 10 is rotated at the constant speed, a variable resistance pattern 11 may be formed by ion beam etching the variable resistance layer 11A using the hard mask pattern 12 as an etch barrier. When the variable resistance pattern 11 is formed, the hard mask pattern 12 may be etched together. That is, when the ion beam etching is completed, the planar shape of the hard mask pattern 12 may be modified to a differential shape from an original circular shape.

In the ion beam etching, an ion beam 20 which is irradiated to the hard mask pattern 12 and the variable resistance layer 11A may have a pulse form, and may be diagonally irradiated with a predetermined incidence angle θ.

The incidence angle θ of the ion beam 20 may be in the range of 0° to 90°. In one implementation, an example that the incidence angle θ is 45° is illustrated. When the incidence angle θ is 0°, the ion beam 20 is perpendicularly irradiated to the wafer 10, and when the incidence angle θ is 90°, the ion beam 20 is horizontally irradiated to the wafer 10. The sidewall shape of the variable resistance pattern 11 may be controlled according to the incidence angle θ of the ion beam 20. Herein, the sidewall shape of the variable resistance pattern 11 may indicate a sidewall slope. For example, the sidewall shape of the variable resistance pattern 11 may be a vertical sidewall or a sloped sidewall according to the incidence angle θ of the ion beam 20.

A pulse period $t_P$ of the ion beam 20 which is supplied in the pulse form may be twice a pulse width $t_W$, and the duty ratio of the ion beam 20 which is supplied in the pulse form may be a 50:50 to easily control an etch shape. That is, one pulse period $t_P$ has two pulse widths $t_W$, and sizes of two pulse widths $t_W$ are the same because the duty ratio is the 50:50.

In the ion beam etching, the planar shape of the variable resistance pattern 11 may be controlled according to the rotation period $t_R$ of the wafer 10 and the pulse period $t_P$ of the ion beam 20. In one implementation, when the rotation period $t_R$ of the wafer 10 and the pulse period $t_P$ of the ion beam 20 are controlled to be equal, the variable resistance pattern 11 having the gibbous moon planar shape illustrated in FIG. 1 may be formed ($t_R=t_P$). That is, in the implementation, the variable resistance pattern 11 of the gibbous moon shape can be easily formed by one etching process.

The ion beam etching can be controlled to provide various planar shapes of the variable resistance element. For example, as illustrated in FIG. 5A, the ion beam etching may form the variable resistance pattern 11 having an elliptical planar shape. When the pulse period $t_P$ of the ion beam 20 is controlled to be two times greater than the rotation period $t_R$ of the wafer 10, the variable resistance pattern 11 of the elliptical shape may be formed ($t_R=2t_P$). A part of the variable resistance element indicated by a dotted line in FIG. 5A illustrates the planar shape of an original hard mask pattern 12.

As illustrated in FIG. 5B, the ion beam etching may form the variable resistance pattern 11 having a cross planar shape. The variable resistance element 11 having the cross planar shape may improve the efficiency of an annealing process due to increase in a surface area as compared with the circular planar shape or the elliptical planar shape, and thus a characteristic of the variable resistance element 11, for example, the magnetic anisotropy may be further improved.

In detail, when the pulse period $t_P$ of the ion beam 20 is controlled to be four times greater than the rotation period $t_R$ of the wafer 10, the variable resistance pattern 11 of the cross shape may be formed ($t_R=4t_P$). A part of the variable resistance element indicated by a dotted line in FIG. 5B illustrates the planar shape of the original hard mask pattern 12.

Hereafter, the electronic device having the variable resistance element may be completed according to known fabrication methods.

As described above, in the method for fabricating the electronic device in accordance with the implementation, various shapes pattern may easily formed by irradiating the ion beam 20 which is supplied in the pulse form on the layer to be etched while rotating the wafer 10.

The semiconductor memory in accordance with the implementation of the present disclosure may be applied to diverse electronic devices or systems. FIGS. 6 to 10 show some examples of electronic devices or systems that can implement the semiconductor memory disclosed herein.

Figure 6:
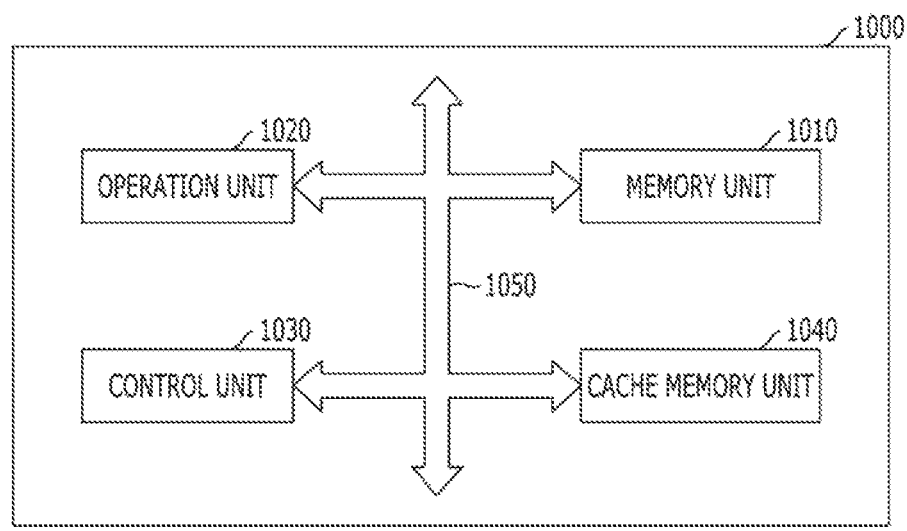
FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. The memory unit 1010 may include semiconductor memory which includes a variable resistance element. The variable resistance element that exhibits different resistance states for storing different data and is structured to include a plan shape including two curved potions of different curvatures. For example, the plan shape may include a gibbous moon plan shape. The plan shape of the variable resistance element may include a first curved portion that is a circular sector of a circle and a second curved portion that has an edge located closer from the center than a circumference of the circle. According to the variable resistance element, a switching current of a variable resistance element may be reduced. Therefore, the semiconductor memory with improved operation characteristics may be provided. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
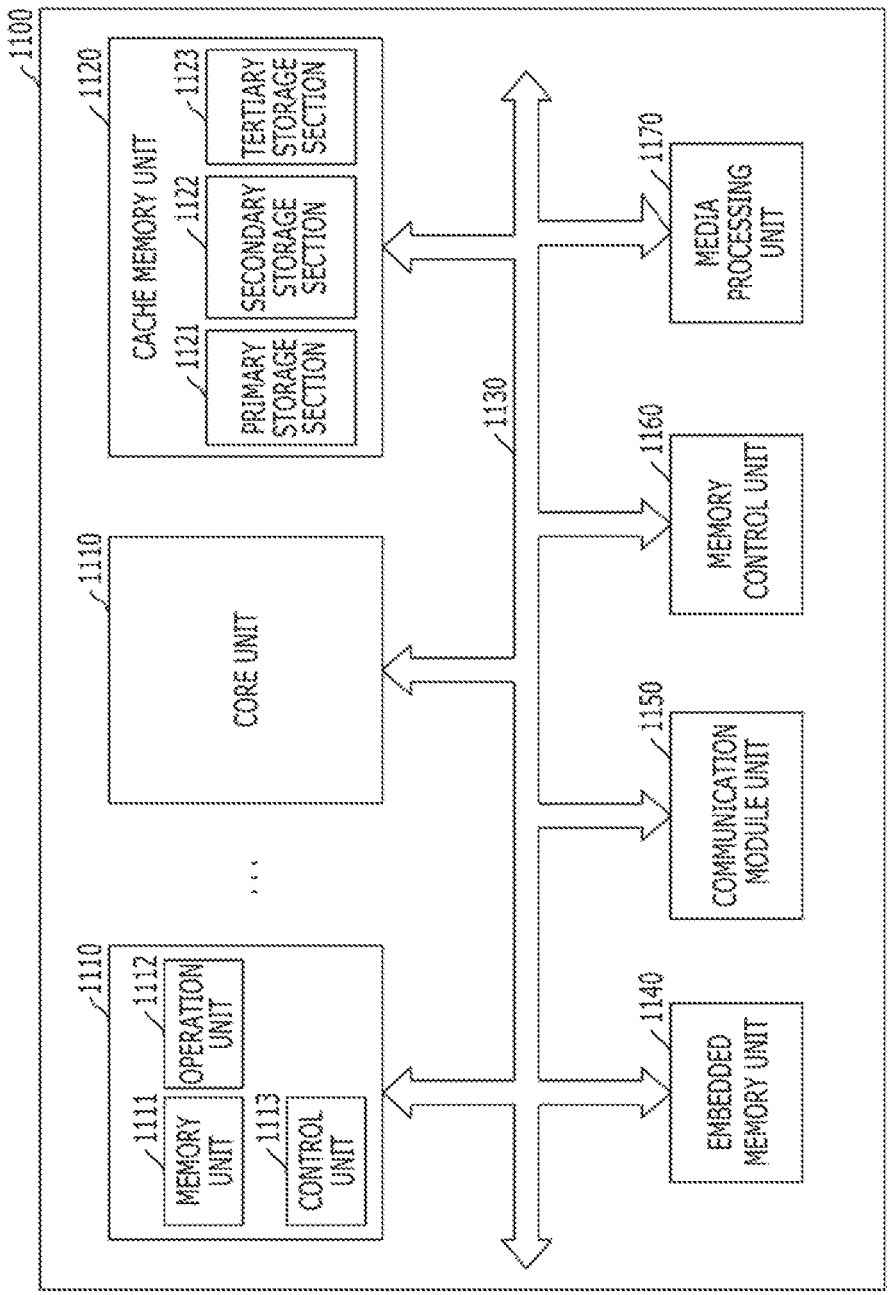
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include semiconductor memory which includes a variable resistance element. The variable resistance element that exhibits different resistance states for storing different data and is structured to include a plan shape including two curved potions of different curvatures. For example, the plan shape may include a gibbous moon plan shape. The plan shape of the variable resistance element may include a first curved portion that is a circular sector of a circle and a second curved portion that has an edge located closer from the center than a circumference of the circle. According to the variable resistance element, a switching current of a variable resistance element may be reduced. Therefore, the semiconductor memory with improved operation characteristics may be provided. Through this, the cache memory unit 1120 and the processor 1100 may have improved reliability.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
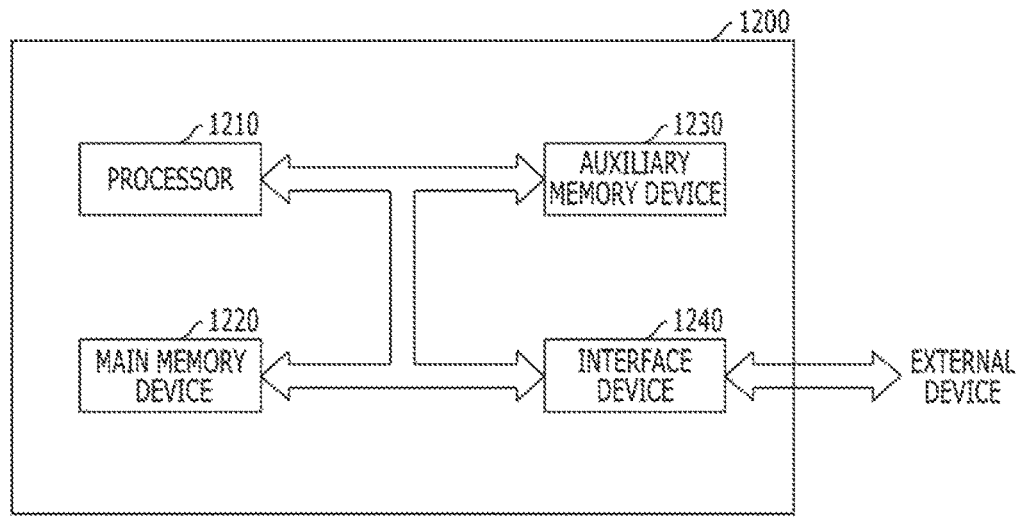
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include semiconductor memory which includes a variable resistance element. The variable resistance element that exhibits different resistance states for storing different data and is structured to include a plan shape including two curved potions of different curvatures. For example, the plan shape may include a gibbous moon plan shape. The plan shape of the variable resistance element may include a first curved portion that is a circular sector of a circle and a second curved portion that has an edge located closer from the center than a circumference of the circle. According to the variable resistance element, a switching current of a variable resistance element may be reduced. Therefore, the semiconductor memory with improved operation characteristics may be provided. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include semiconductor memory which includes a variable resistance element. The variable resistance element that exhibits different resistance states for storing different data and is structured to include a plan shape including two curved potions of different curvatures. For example, the plan shape may include a gibbous moon plan shape. The plan shape of the variable resistance element may include a first curved portion that is a circular sector of a circle and a second curved portion that has an edge located closer from the center than a circumference of the circle. According to the variable resistance element, a switching current of a variable resistance element may be reduced. Therefore, the semiconductor memory with improved operation characteristics may be provided. Through this, the auxiliary memory device 1230 and the system 1200 may have improved reliability.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
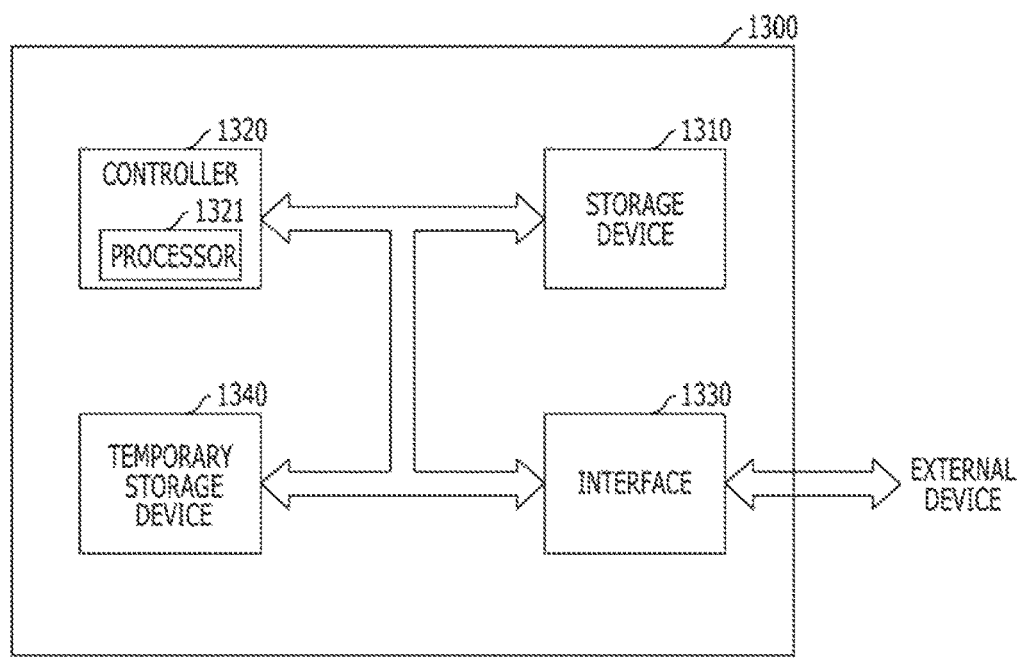
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include semiconductor memory which includes a variable resistance element. The variable resistance element that exhibits different resistance states for storing different data and is structured to include a plan shape including two curved potions of different curvatures. For example, the plan shape may include a gibbous moon plan shape. The plan shape of the variable resistance element may include a first curved portion that is a circular sector of a circle and a second curved portion that has an edge located closer from the center than a circumference of the circle. According to the variable resistance element, a switching current of a variable resistance element may be reduced. Therefore, the semiconductor memory with improved operation characteristics may be provided. Through this, the temporary storage device 1340 and the data storage system 1300 may have improved reliability.

Figure 10:
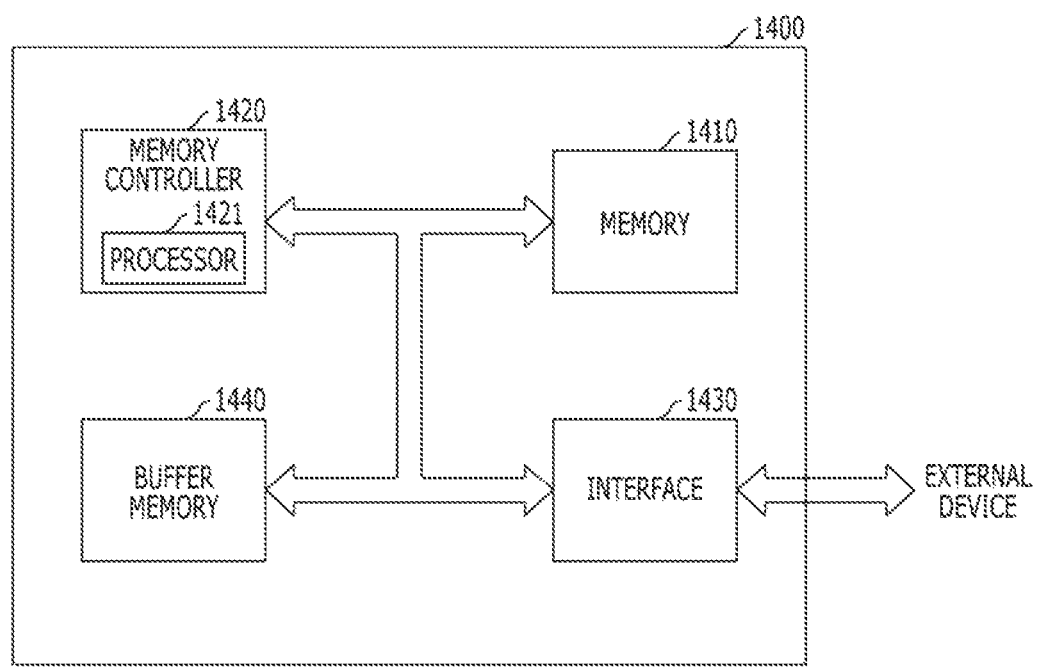
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include semiconductor memory which includes a variable resistance element. The variable resistance element that exhibits different resistance states for storing different data and is structured to include a plan shape including two curved potions of different curvatures. For example, the plan shape may include a gibbous moon plan shape. The plan shape of the variable resistance element may include a first curved portion that is a circular sector of a circle and a second curved portion that has an edge located closer from the center than a circumference of the circle. According to the variable resistance element, a switching current of a variable resistance element may be reduced. Therefore, the semiconductor memory with improved operation characteristics may be provided. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include semiconductor memory which includes a variable resistance element. The variable resistance element that exhibits different resistance states for storing different data and is structured to include a plan shape including two curved potions of different curvatures. For example, the plan shape may include a gibbous moon plan shape. The plan shape of the variable resistance element may include a first curved portion that is a circular sector of a circle and a second curved portion that has an edge located closer from the center than a circumference of the circle. According to the variable resistance element, a switching current of a variable resistance element may be reduced. Therefore, the semiconductor memory with improved operation characteristics may be provided. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6 to 10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device, the method comprising:
   forming a variable resistance layer on a wafer; and
   forming a variable resistance pattern by etching the variable resistance layer,
   wherein the forming of the variable resistance pattern includes performing an ion beam etching in which an ion beam is supplied in a pulse form while rotating the wafer,
   wherein the performing of the ion beam etching includes configuring the variable resistance pattern to have a gibbous moon planar shape that is asymmetric along a direction perpendicular to a surface of the variable resistance element.

2. The method of claim 1, wherein a pulse period of the ion beam is twice a pulse width, and a duty ratio of the ion beam is a 50:50.

3. The method of claim 1, wherein the performing of the ion beam etching includes radiating the ion beam diagonally with a predetermined incidence angle.

4. The method of claim 1, wherein in the forming of the variable resistance pattern, a rotation period of the wafer and a pulse period of the ion beam are controlled to be equal.

5. The method of claim 1, wherein in the forming of the variable resistance pattern, a pulse period of the ion beam is controlled to be four times greater than a rotation period of the wafer.

6. A method for fabricating an electronic device, the method comprising:
   forming a variable resistance layer on a wafer; and forming a variable resistance pattern by etching the variable resistance layer using an ion beam etching in which an ion beam is supplied in a pulse form while rotating the wafer, wherein the etching of the variable resistance layer is performed to configure the variable resistance pattern to have a gibbous moon planar shape, wherein the gibbous moon planar shape comprises a first curved portion that is a circular sector of a circle and a second curved portion that has an edge located closer from the center than a circumference of the circle, wherein the two curved portions have different central angles and different curvatures and share a common center.

7. The method of claim 6, wherein in the forming of the variable resistance pattern, a rotation period of the wafer and a pulse period of the ion beam are controlled to be equal.

8. The method of claim 6, wherein a pulse period of the ion beam is twice a pulse width, and a duty ratio of the ion beam is a 50:50.

9. The method of claim 6, wherein in the forming of the variable resistance pattern, the ion beam is diagonally irradiated with a predetermined incidence angle.

10. The method of claim 1, wherein the gibbous moon planar shape comprises a first curved portion that is a circular sector of a circle and a second curved portion that has an edge located closer from the center than a circumference of the circle, wherein the two curved portions have different central angles and different curvatures and share a common center.

11. The method of claim 1, wherein the configuring the variable resistance pattern includes controlling a pulse period of the ion beam and a duty ratio of the ion beam.

12. A method for fabricating an electronic device, the method comprising:

forming a variable resistance layer on a wafer; and forming a variable resistance pattern by etching the variable resistance layer using an ion beam etching in which an ion beam is supplied in a pulse form while rotating the wafer, wherein the etching of the variable resistance layer is performed to configure the variable resistance pattern to have a gibbous moon planar shape, wherein the variable resistance pattern has an asymmetric shape along a direction perpendicular to a surface of the variable resistance element.

13. The method of claim 6, wherein the etching of the variable resistance layer includes controlling a pulse period of the ion beam and a duty ratio of the ion beam.

* * * * *